United States Patent
Wu

(10) Patent No.: US 6,227,701 B1
(45) Date of Patent: May 8, 2001

(54) APPARATUS FOR THERMALLY TESTING AN ELECTRONIC DEVICE

(75) Inventor: Wen-Shien Wu, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 09/368,357

(22) Filed: Aug. 5, 1999

(30) Foreign Application Priority Data

Jun. 8, 1998 (TW) .................................................. 87212846

(51) Int. Cl.⁷ .......................... G01D 21/00; G01N 25/00
(52) U.S. Cl. ......................... 374/57; 374/45; 73/865.6; 73/865.8; 436/147
(58) Field of Search ................................ 374/4, 5, 57, 1, 374/45, 33; 73/865.6, 865.8; 436/147

(56) References Cited

U.S. PATENT DOCUMENTS

| | | | |
|---|---|---|---|
| Re. 32,625 | * 3/1988 | Schwarz et al. ................ | 374/47 |
| 4,575,257 | * 3/1986 | Ogura et al. .................... | 374/57 |
| 4,962,355 | * 10/1990 | Holderfield et al. ........... | 324/158 F |
| 5,103,168 | * 4/1992 | Fuoco .............................. | 324/158 F |
| 5,147,136 | * 9/1992 | Hartley et al. .................. | 374/57 |
| 5,167,451 | * 12/1992 | Muller et al. ................... | 374/45 |
| 5,269,370 | * 12/1993 | Cristian et al. ................. | 165/61 |
| 5,707,147 | * 1/1998 | Kurkowski et al. ............ | 374/1 |
| 6,097,001 | * 8/2000 | Richardson et al. ........... | 219/400 |
| 6,098,473 | * 8/2000 | Hafner ............................ | 73/865.8 |
| 6,113,262 | * 9/2000 | Purola et al. ................... | 374/57 |

FOREIGN PATENT DOCUMENTS

| | | | |
|---|---|---|---|
| 0144580 | * 7/1986 | (JP) ................................ | 374/57 |
| 001567924 | * 5/1990 | (SU) ............................... | 374/57 |

* cited by examiner

Primary Examiner—G. Bradley Bennett
Assistant Examiner—Gail Verbitsky
(74) Attorney, Agent, or Firm—Birch, Stewart, Kolasch & Birch, LLP

(57) ABSTRACT

A turbulent plate is installed nearby the heat source of an apparatus for thermally testing an electronic device. The testing apparatus comprises a main body and a pallet. The main body is formed with a first chamber for receiving the electronic device, and a second chamber located around and communicated with the first chamber. The pallet having a plate mounted with window and a through hole filled with corrugated heat insulators, supports the electronic device, which is turned on and received in the first chamber. The status of the electronic device can be inspected through the window. The heat insulators fully envelop a lead wire passed the through hole and connected between the portable computer and a power supply.

10 Claims, 3 Drawing Sheets

APPARATUS FOR THERMALLY TESTING AN ELECTRONIC DEVICE

FIELD OF THE INVENTION

The present invention relates to a thermal testing apparatus using a turbulent plate, and in particular to an apparatus installed with a turbulent plate near a heat source so as to precisely test an electronic device in an environment with a uniform temperature.

DESCRIPTION OF THE PRIOR ART

Generally, the problems of a hot box for testing an electronic device are:

(a) The structure of the hot box is complicated, and temperatures measured at different sites in the hot box are not uniform.

(b) The heat in the hot box is easily lost by way of a lead wire electrically connected between the electronic device and a power supply located outside of the hot box.

(c) An electronic device, such as a portable computer, located in the hot box is not easily inspected from outside of the hot box.

SUMMARY OF THE INVENTION

It is therefore an object of the invention to provide an apparatus for thermally testing an electronic device solving the above mentioned problems. The present invention mainly comprises a main body and a pallet. The main body is formed with a first chamber for receiving the electronic device and a second chamber located around and communicating with the first chamber, wherein the second chamber has an opening communicating the first chamber with the outside of the main body. The pallet, having a base for supporting the electronic device within the first chamber and a window for inspecting the status of the electronic device, is received into the main body through the opening, thereby closing off the first chamber from the outside of the main body. A heat source is installed in the second chamber, and at least one turbulent plate is disposed near the heat source. A plurality of fans are installed in the second chamber and activated to form a circulation between the first chamber and the second chamber. A controlling device mounted on the main body controls the heat source and the wobbling rate of the turbulent plate depending on the temperatures sensed in the first chamber and the second chamber, so that the temperatures in the vicinity of the electronic device are uniform.

According to an aspect of the invention, the electronic device such as a portable computer is electrically connected to a power supply located outside of the main body. A through hole formed in the pallet and filled with heat insulation serves as a passage for the lead wire. Each of the heat insulators has corrugated surfaces and the lead wire is clamped therebetween.

BRIEF DESCRIPTION OF THE DRAWINGS

The present invention can be more fully understood from the following detailed description and preferred embodiment with reference to the accompanying drawings in which.

DETAILED DESCRIPTION OF THE PREFERRED EMBODIMENTS OF THE INVENTION

Figure 1:
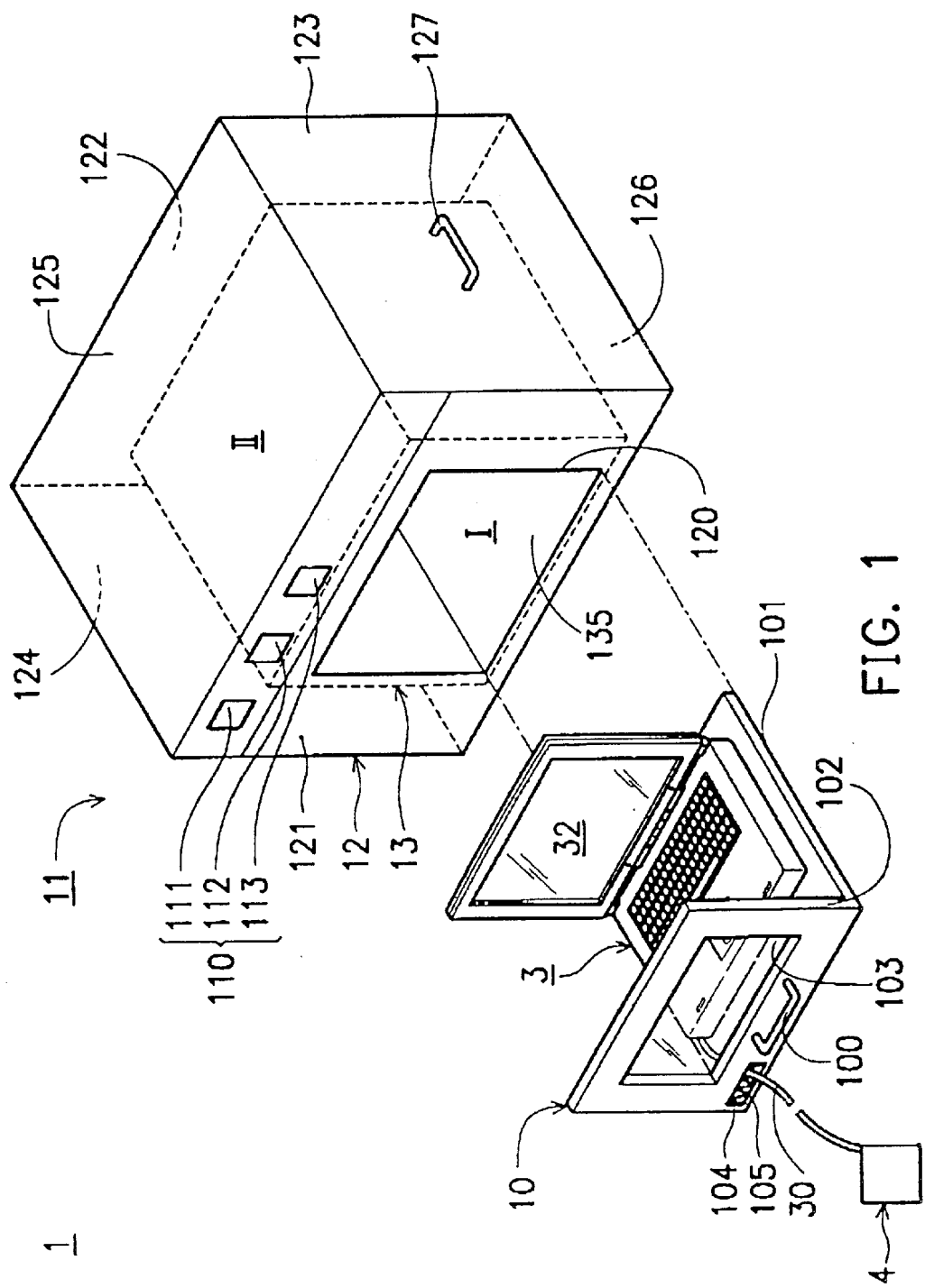
FIG. 1 is a perspective view of a thermal testing apparatus of the present invention.

Referring to FIG. 1, a perspective view shows a thermal testing apparatus 1 according to the invention. The heat testing apparatus 1 comprises a pallet 10 and a main body 11, wherein the pallet 10 supports an electronic device 3, such as a portable computer, positioned in the main body 11.

The main body 11 is a substantially box-like structure comprising a first housing 12 and a second housing 13, wherein a first chamber I and a second chamber II are formed therein by the separation of the second housing 13.

Figure 3:
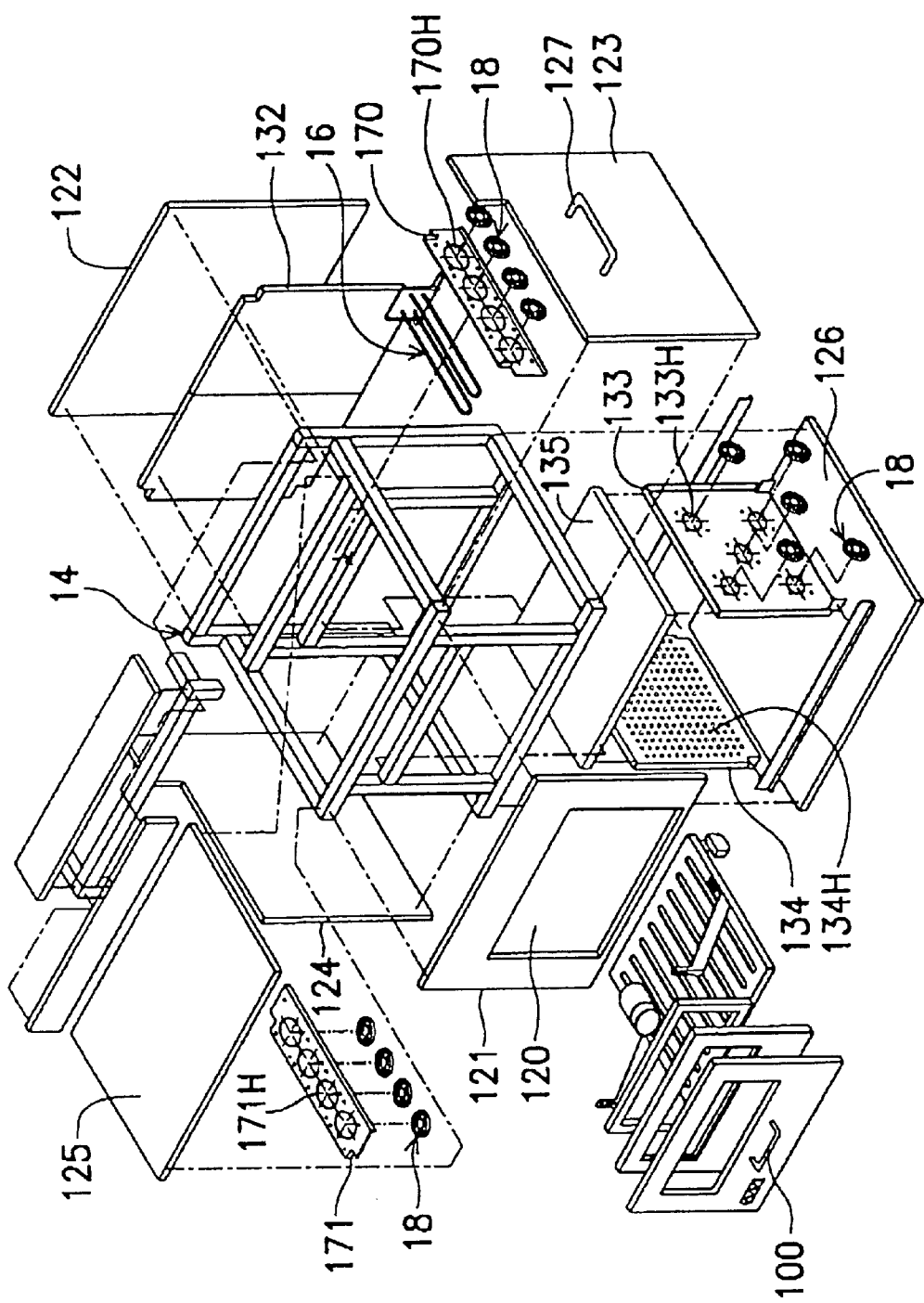
FIG. 3 is an exploded view of the thermal testing apparatus of FIG. 1.

Referring also to FIG. 3, the first housing 12 is composed of a front plate 121 formed with the opening 120, a rear plate 122, two side plates 123 and 124, a top plate 125 and a bottom plate 126. The second housing 13 is located within the first housing 12. The second housing 13 is composed a rear plate 132, a side plate 133 formed with a plurality of guiding holes 133H mounted with fans 18 respectively, a perforated plate 134 disposed opposite the side plate 133, and a top plate 135. All the plates of the first housing 12 and the second housing 13 are supported by a frame structure 14. A handle 127 is respectively mounted on the plates 123, 124 so as to move the main body easily.

Referring again to FIG. 1, the second chamber II is a substantially U-shaped channel formed about the second housing 13. The first chamber I has an opening 120 to receive the portable computer 3 therein. The portable computer 3 is turned on and electrically connected to a power supply 4 by a lead wire 30 during testing. The pallet 10, comprising a base plate 101 and a vertical plate 102, is an L-shaped member used to carry the portable computer 3 into the first chamber I through the opening 120. The base plate 101 is used to support the portable computer 3, and the vertical plate 102 has a window 103 and a through hole 104. In addition, a handle 100 is mounted on the sidewall of the vertical plate 102. When the portable computer 3 is placed in the first chamber I by the pallet 10 for testing, the lead wire 30 connected to the portable computer 3 is passed through the through hole 104 to the outside of the main body 11. The lead wire 30 passed the through hole 104 is enveloped with heat insulators 105 therein. Each of the heat insulators 105 has a corrugated surface and the lead wire 30 is tightly clamped therebetween, so that there is no heat leaked to outside of the main body 11 via the through hole 104. During the testing process, the display of the monitor 32 of the portable computer 3 can be inspected through the window 103. A controlling device 110 comprising a power switch 111, a timing device 112 and a thermometer 113 is located on the front plate 121 of the first housing 12.

Figure 2:
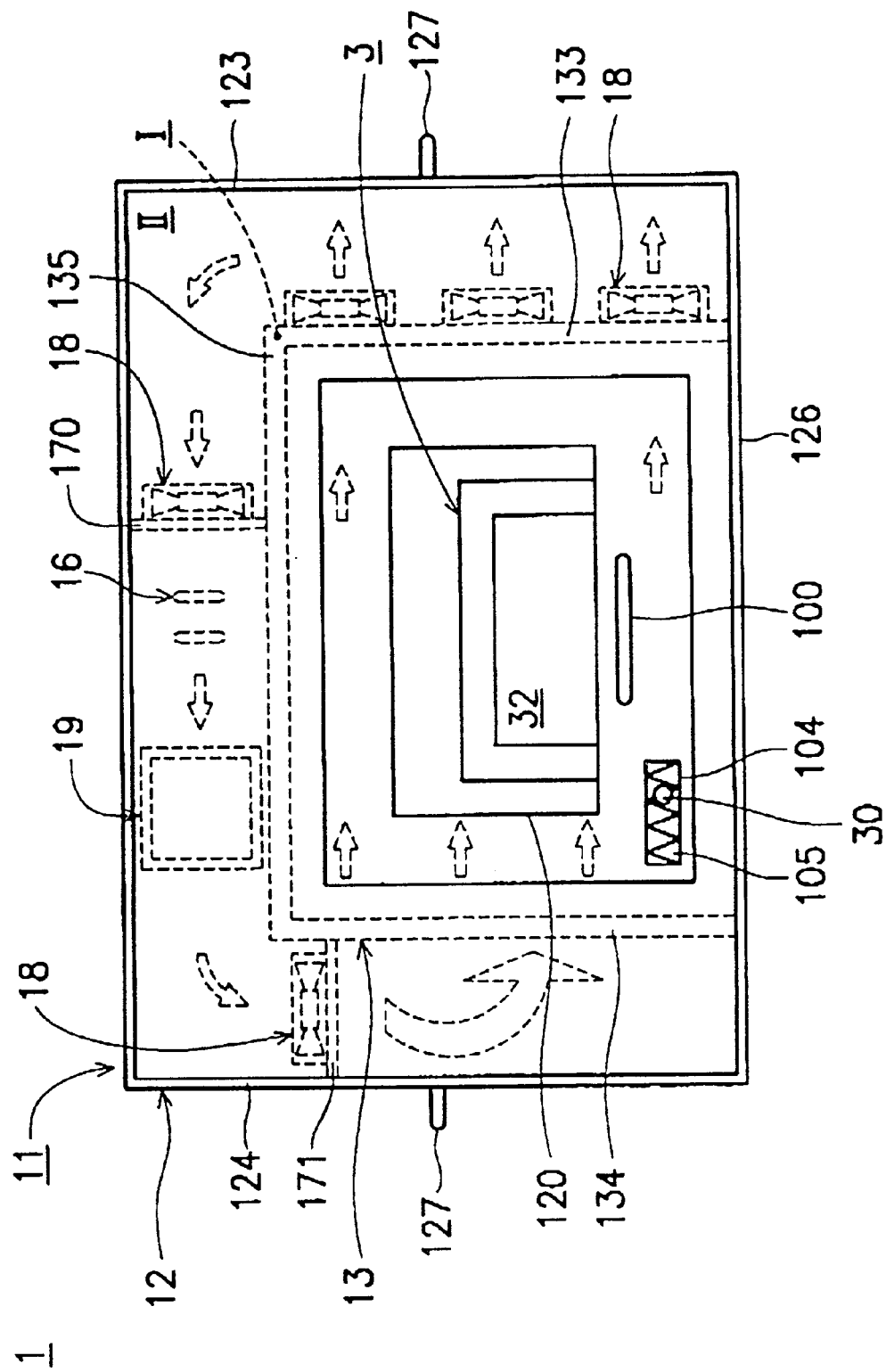
FIG. 2 is a front view of the thermal testing apparatus of FIG. 1.

Referring to FIG. 2, a front view shows the heat convection of the heat testing apparatus 1. A heat source 16 such as a thermocouple is controlled by the controlling device 110 and installed in the second chamber II, located above the top plate 135 of the second housing 13. Two plates 170, 171 are formed with a plurality of guiding holes 170H, 171H, each of which mounted with a fan 18, respectively. The plates 170, 171 are respectively disposed in the second chamber II and the heat source 16 is located therebetween. A turbulent plate 19 is installed in the second chamber II and located nearby the heat source 16. The heat source 16, the turbulent plate 19 and the fans 18 are controlled by the controlling device 110.

When all the fans 18 are activated, heat generated from the heat source 16 is forcedly driven into the first chamber I through the holes 134H of the perforated plate 134, and then expelled out off the first chamber I by the fans 18 mounted on the side plate 133. The controlling device 110 can regulate the wobbling rate of the turbulent plate 19 according to the heat values measured from selected sites in the first chamber I and the second chamber II. Therefore, a regular circulation between the first chamber I and the second chamber II is achieved, and the rate of heat flow around the portable computer 3 is uniform.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. An apparatus for thermally testing a running electronic device, comprising:

a main body formed with a first chamber for receiving said electronic device and a second chamber located around and communicating with said first chamber, wherein said second chamber has an opening communicating said first chamber to the outside of said body;

a pallet receivable into said main body through said opening for closing off said first chamber from the outside of said main body, said pallet having a base for supporting said electronic device within said first chamber and a window for inspecting said electronic device therein;

a heat source located in said second chamber;

means for blowing the heat flow generated by said heat source to circulate between said first chamber and said second chamber;

means for forming a turbulent effect to average the temperature within said first chamber and said second chamber, located in said second chamber and installed near said heat source.

2. The apparatus as claimed in claim 1, wherein said means for forming a turbulent effect is a turbulent plate mounted within said second chamber.

3. The apparatus as claimed in claim 2, wherein said for blowing the heat flow means is a plurality of fans mounted within said second chamber.

4. The apparatus as claimed in claim 3, wherein a control device installed on said main body is used to control said heat source, said fans and said turbulent plate.

5. The apparatus as claimed in claim 4, wherein said first chamber and said second chamber are separated by a plurality of perforated plates.

6. The apparatus as claimed in claim 5, wherein said perforated plates are mounted with a plurality of fans.

7. The apparatus as claimed in claim 6, wherein said electronic device is electrically connected to a power supply located outside the main body by a lead wire, and said pallet has a through hole serving as a passage for the lead wire.

8. The apparatus as claimed in claim 7, wherein said through hole is filled with heat insulators.

9. The apparatus as claimed in claim 8, wherein each of said heat insulators has a corrugated surface and said lead wire is clamped therebetween.

10. The apparatus as claimed in claim 9, wherein said electronic device is a portable computer.

\* \* \* \* \*